(12) United States Patent
Van De Logt et al.

(10) Patent No.: US 7,199,573 B2
(45) Date of Patent: Apr. 3, 2007

(54) ELECTRONIC CIRCUIT WITH TEST UNIT

(75) Inventors: Leon Maria Albertus Van De Logt, Eindhoven (NL); Franciscus Gerardus Maria De Jong, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/520,198

(22) PCT Filed: Jun. 20, 2003

(86) PCT No.: PCT/IB03/02957

§ 371 (c)(1), (2), (4) Date: Jul. 20, 2005

(87) PCT Pub. No.: WO2004/005946

PCT Pub. Date: Jan. 15, 2004

(65) Prior Publication Data

US 2006/0061376 A1 Mar. 23, 2006

(30) Foreign Application Priority Data

Jul. 8, 2002 (EP) .................................. 02077733

(51) Int. Cl.
*G01R 31/28* (2006.01)
(52) U.S. Cl. .................................................. 324/158.1
(58) Field of Classification Search ...................... None
See application file for complete search history.

(56) References Cited

U.S. PATENT DOCUMENTS

| 4,556,840 | A | * | 12/1985 | Russell ........................ 714/738 |
|---|---|---|---|---|
| 4,575,648 | A | * | 3/1986 | Lee ............................... 326/55 |
| 4,789,951 | A | * | 12/1988 | Birkner et al. ................. 326/40 |
| 5,180,046 | A | * | 1/1993 | Hutton et al. ................ 194/319 |
| 5,224,107 | A | * | 6/1993 | Mattes ......................... 714/805 |
| 5,241,265 | A | * | 8/1993 | McDonnell et al. ......... 714/726 |
| 5,936,427 | A | * | 8/1999 | Tsujihashi ...................... 326/54 |
| 6,144,595 | A | * | 11/2000 | Hirooka et al. .............. 365/201 |
| 6,208,571 | B1 | | 3/2001 | Ikeda et al. |
| 6,400,621 | B2 | * | 6/2002 | Hidaka et al. ............... 365/200 |
| 6,591,384 | B1 | * | 7/2003 | Chou ........................... 714/718 |
| 6,622,108 | B1 | * | 9/2003 | De Jong et al. ............. 702/118 |

FOREIGN PATENT DOCUMENTS

| EP | 0979418 B1 | 8/1999 |
|---|---|---|
| JP | 63005272 A | 1/1988 |
| WO | WO9939218 A2 | 8/1999 |

* cited by examiner

*Primary Examiner*—Vinh Nguyen
*Assistant Examiner*—Richard Isla-Rodas

(57) ABSTRACT

A test arrangement for testing the interconnections of an electronic circuit (100) and a further electronic circuit is provided. A first selection of I/O nodes (120), which are arranged to receive input data in a functional mode of the electronic circuit (100), and which are coupled to a test unit in a test mode of the electronic circuit (100). The test unit has a combinatorial circuit (160) for implementing a multiple-input XOR or XNOR gate. The test unit also provides interconnections between the first selection of I/O nodes (120) and a second selection of I/O nodes (130) via logic gates (141–144). These interconnections increase the interconnect test coverage of the electronic device (100), because the interconnects with the further electronic circuits that are associated with I/O nodes (131–134) become testable as well.

7 Claims, 2 Drawing Sheets

ELECTRONIC CIRCUIT WITH TEST UNIT

The present invention relates to an electronic circuit, comprising a plurality of input/output (I/O) nodes for connecting the electronic circuit to at least a further electronic circuit via interconnects; a test unit for testing the interconnects in a test mode of the electronic circuit, the test unit comprising a combinatorial circuit having a plurality of inputs and an output, the combinatorial circuit implementing an exclusive logic function; the I/O nodes being logically connected to the test unit in the test mode, wherein a first selection of the I/O nodes is arranged to carry respective input signals and is connected to the plurality of inputs of the combinatorial circuit; and a second selection of the I/O nodes comprises a first node and is arranged to carry respective output signals, the first node being coupled to the output of the combinatorial circuit.

Nowadays, electronic devices typically include a plurality of interconnected electronic circuits, e.g. integrated circuits, memory devices and so on, that may be mounted on a printed circuit board. In order to ensure the structural integrity of such electronic devices, the interconnects between the electronic circuits have to be testable. A standardized way of facilitating such interconnect test by means of the IEEE 1149.1 standard, i.e. boundary scan test (BST). In accordance with this standard, an electronic circuit is extended with dedicated hardware, e.g. a shift register, under control of a state machine integrated in the test access port (TAP) controller under control of test signals that are provided to the TAP controller through dedicated pins. BST provides a versatile and robust way of testing the electronic circuit interconnects, which has led to widespread implementation of BST in many electronic circuits. However, in certain semiconductor fields, e.g. the field of memory devices like SDRAM and flash memories, the price-pressure is so high that the BST is not an acceptable solution, for instance because of the fact that inclusion of the required dedicated boundary scan pins in the electronic circuit would lead to an increase of the pins required for the circuit, which would render the circuit being too expensive.

An interconnect test solution for electronic circuits in those semiconductor fields is provided by laid-open European patent application EP 0979418-A1, which discloses an electronic circuit according to the opening paragraph. The electronic circuit according to European patent application EP 0979418-A1 provides an arrangement for testing the interconnects of electronic circuits without the need for a plurality of additional, dedicated pins. The circuit comprises a test unit implementing an XOR or an XNOR function between a multitude of circuit inputs and a circuit output. Consequently, all single stuck-at faults at and single bridging faults between the interconnections at the input side can be detected at the output of the test unit when appropriate test patterns are provided to the test unit.

However, it is a disadvantage that when the electronic circuit has a plurality of nodes being arranged to carry respective output signals, only the interconnection of the node that is connected to the output of the test unit is tested. To render the remaining output nodes testable, additional combinatorial circuitry has to be included, which introduces additional area dedicated to the test arrangement of the electronic device, thus adding to the cost of the electronic device.

Inter alia, it is an object of the present invention to provide an electronic circuit according to the opening paragraph with simplified output interconnection testability.

Now, the object of the invention is realized in that the second selection of I/O nodes further comprises a second node that is coupled to an I/O node from the first selection of I/O nodes in the test mode via a connection that bypasses the combinatorial circuit. The routing of input signals substantially directly to the outputs provides a more straightforward detectability of interconnection faults, because also stuck-at faults at the output node coupled to the input node can be detected. This particularly applies to electronic devices carrying a single fault, because the distinction between the output signal at the first I/O node originating from the combinatorial circuit and the output signal at the second I/O node originating from the input I/O node will enable the detectability of the stuck-at fault at the second I/O node. An additional advantage of the present invention is that it provides better diagnostics for electronic devices having an even number of I/O nodes coupled to the inputs of the combinatorial circuit. For an XOR or XNOR tree obeying the design rules of the circuit disclosed in European patent application EP 0979418-A1, the number of inputs has to be an odd number to allow for full diagnosis, e.g. the functionality to localize the stuck-at or bridging fault in the interconnects, since with an even number of inputs the localization of some faults is not possible due to the fact that different faults lead to identical output patterns for the combinatorial circuit. Good diagnostic coverage is important if a desire exists to repair the faulty interconnections in the electronic device, in order to avoid the disposal of the device and the associated loss of money. The additional test result that can be obtained through the second I/O node also provides additional information about the behavior of the interconnects on the input side of the electronic circuit, which means that the diagnosis of the test arrangement is improved. It is pointed out that the second I/O node is preferably coupled to the I/O node from the first selection of I/O nodes via an additional gate, e.g. a buffer or an inverter, to avoid faults on the output side influence the behavior of the I/O node on the input side.

It is an advantage if the second selection of I/O nodes further comprises a third node being coupled to a further I/O node from the first selection of I/O nodes in the test mode via a further connection that bypasses the combinatorial circuit. The presence of a plurality of connections from input nodes to output nodes obviously improves the fault coverage of the electronic circuit interconnects, not only because more interconnects can be tested but also because bridging faults between interconnects coupled to the second selection of I/O nodes can be discovered.

It is a further advantage if the second node is coupled to the I/O node from the first selection of I/O nodes via an inverter and the third node is coupled to the further I/O node from the first selection of I/O nodes via a buffer circuit. This arrangement allows for the localization of wired AND faults between the interconnects associated with the first and second I/O node from the second selection and the I/O node and the further I/O node from the first selection, because the inverting properties in only one of the two connections between the pair of input and output I/O nodes allows for the detection of bridging AND faults both before and after the gates.

In an embodiment of the present invention, the electronic circuit comprises a test control node, the electronic circuit being arranged to switch to the test mode responsive to the reception of a test control signal on the test control node. This has the advantage that the electronic circuit can be brought into a test mode by means of a single dedicated pin and a single signal, which enables fast switching from a functional mode of the electronic circuit, in which the I/O pins are logically connected to a main unit implementing the desired functional behavior of the electronic circuit, and the test mode.

In another embodiment of the present invention, the electronic circuit comprises a main unit being logically connected to the I/O nodes in a functional mode, the main unit being arranged to bring the electronic circuit into the test mode upon receipt of a test control signal in a form of a predefined bit pattern through at least a subset of the first selection of I/O nodes. This arrangement has the advantage that by addition of some test control circuitry to the main unit no additional pin is required to bring the electronic circuit into the test mode.

Now, another object of the present invention is realized by the electronic circuit arrangement that facilitates a built-in self-test for the electronic circuit, because the further electronic circuit can operate as the test device for the electronic circuit, which obviates the need for expensive dedicated tester equipment.

It is an advantage if the further electronic circuit is arranged to receive test result data from the second selection of I/O nodes. This way, both test generation and test evaluation can be done by the same circuit.

Now, yet another object of the invention is realized by the method of interconnect testing to provide better fault detection compared to the method disclosed in the aforementioned prior art, because more interconnect faults at the output side of the electronic circuit are detectable.

The invention is described in more detail and by way of non-limiting examples with reference to the accompanying drawings, wherein.

Figure 1:
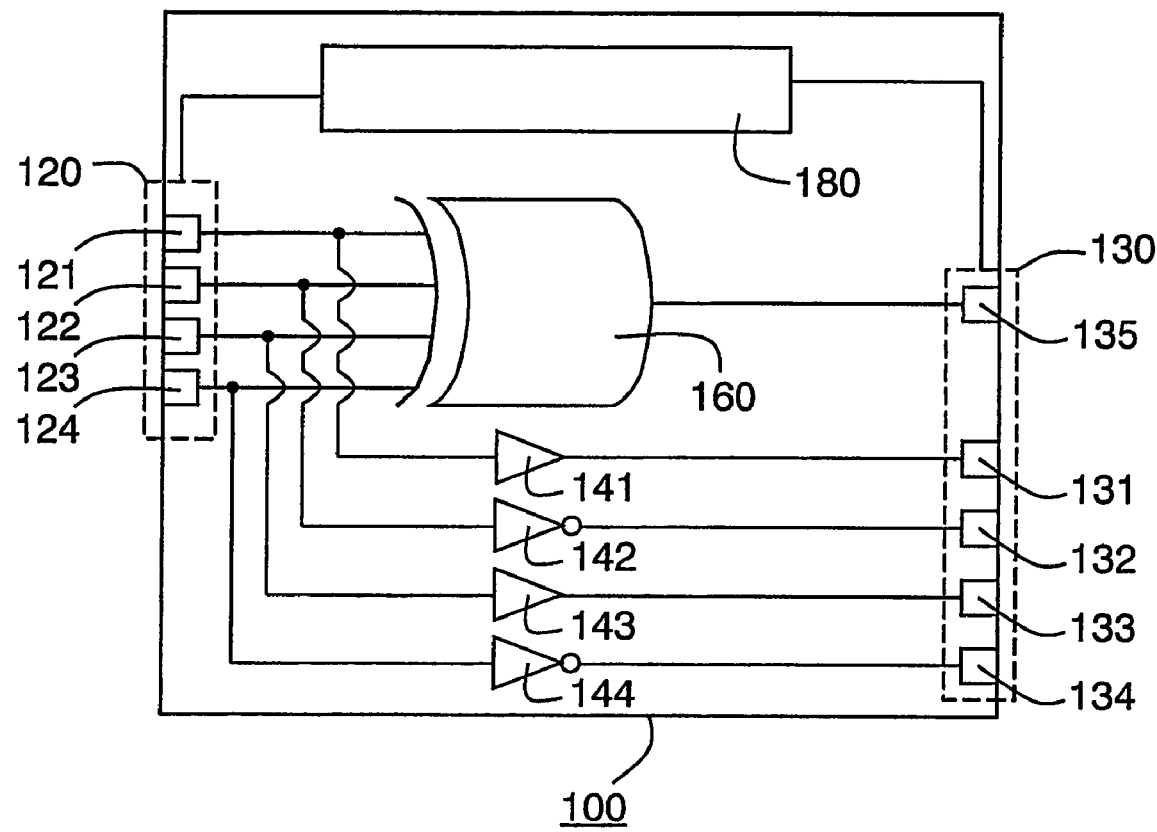
FIG. 1 depicts an electronic circuit with a test unit according to the present invention.

In FIG. 1, the electronic circuit has a plurality of I/O nodes 120 and 130 for connecting the electronic circuit 100 to at least a further electronic circuit not shown via interconnects. This plurality of I/O nodes is partitioned in a first selection of I/O nodes 120 including four I/O nodes 121–124 and a second selection of I/O nodes 130 including five I/O nodes 131–135. The first selection of I/O nodes 120 can include input nodes, bidirectional nodes or a combination of both, whereas the second selection of I/O nodes 130 can include output nodes, bidirectional nodes or a combination of both. The plurality of I/O nodes 120 and 130 are connected to a test unit in a test mode of electronic circuit 100 for testing the interconnects of electronic circuit 100 with a further electronic circuit not shown. The plurality of I/O nodes 120 and 130 are connected to a main unit 180 in a functional mode implementing a normal mode function of the electronic circuit 100. The test unit has a combinatorial circuit 160, which implements an exclusive logic function, e.g. a multiple input XOR or a multiple input XNOR gate producing a result, preferably at a single output although this is not a prerequisite. The first selection of I/O nodes 120 is arranged to carry respective input signals and is connected to the plurality of inputs of the combinatorial circuit 160, while the second selection of the I/O nodes 130 is arranged to carry respective output signals, and has a first I/O node 135 that is coupled to the output of the combinatorial circuit 160. The combinatorial circuit 160 ensures that, in the case of an electronic circuit 100 having a single interconnect fault, the interconnect fault will be detected, provided that the interconnect fault is located on the interconnections that are testable through the first selection of I/O nodes 120 or through first I/O node 135 and provided that the appropriate test patterns are fed to the combinatorial circuit 160.

In order to improve the interconnect test coverage, the test unit is extended by connections between I/O nodes 121–124 from the first selection of I/O nodes 120 and I/O nodes 131–134 from the second selection of I/O nodes 130 respectively, via an alternating pattern of logic gates 141–144, e.g. buffer circuits 141 and 143, and inverters 142 and 144. It is emphasized that, although an alternating buffer/inverter pattern is preferred, it is not strictly necessary; patterns with buffer circuits or inverters only or other mixtures of inverters and buffer circuits are equally valid, although such patterns will lack some of the benefits of the alternating pattern (vide infra). It will be obvious that the choice of an electronic circuit 100 having exactly four input nodes 121–124 and exactly five output nodes 131–135 is by way of non-limiting example only; other numbers of I/O nodes with other ratios between the first selection of I/O nodes 120 and the second selection of I/O nodes 130 are possible without departing from the teachings of the present invention. In addition, not every node from the first selection of I/O nodes 120 has to be connected to a node from the second selection of I/O nodes 130 and vice versa, although it is pointed out that all outputs preferably are connected to a respective input in order to maximize the fault coverage on the output side of electronic circuit 100.

An important additional advantage of the extension of the test unit 160 with the connections between respective I/O nodes 121–124 and I/O nodes 131–134 is that the fault detection is improved in case an even number of faults occurs in the interconnects between electronic circuit 100 and the further electronic circuit not shown. In such cases, the faults will cancel out in combinatorial logic circuit 160 and the test result extracted from I/O nodes 135 is likely to suggest that all interconnects between the electronic device 100 and the further electronic device not shown are fault-free. However, the additional interconnections between the plurality of I/O nodes 120 and the plurality of I/O nodes 130 provide additional test results, which will prevent the erroneous evaluation of the test results provided that at least one of the interconnects associated with the even number of interconnect faults is coupled to the additional interconnections between the plurality of I/O nodes 120 and the plurality of I/O nodes 130.

An appropriate test pattern for the test unit as depicted in FIG. 1 can be a sequential pattern of all 0's, of a walking 1, of all 0's and of a walking 0. In Table I, the detectable output signals at I/O nodes 131–135 resulting from such a pattern for a combinatorial circuit 160 implementing an XOR gate and an XNOR gate respectively are listed for a fault-free electronic circuit 100 as shown in FIG. 1.

| pattern number | I/O nodes 121–124 | I/O nodes 131–135 (XOR gate) | I/O nodes 131–135 (XNOR gate) |
| --- | --- | --- | --- |
| 1 | 0000 | 01010 | 01011 |
| 2 | 1000 | 11011 | 11010 |
| 3 | 0100 | 00011 | 00010 |

-continued

| pattern number | I/O nodes 121–124 | I/O nodes 131–135 (XOR gate) | I/O nodes 131–135 (XNOR gate) |
|---|---|---|---|
| 4 | 0010 | 01111 | 01110 |
| 5 | 0001 | 01001 | 01000 |
| 6 | 1111 | 10100 | 10101 |
| 7 | 0111 | 00101 | 00100 |
| 8 | 1011 | 11101 | 11100 |
| 9 | 1101 | 10001 | 10000 |
| 10 | 1110 | 10111 | 10110 |

Electronic circuit 100 can be brought in the test mode by several known ways, which for instance have been disclosed in the aforementioned European patent application EP 9901802. Main unit 180 can be arranged to switch the electronic circuit 100 to a test mode upon receipt of a predefined bit pattern or a sequence of predefined bit patterns via at least some of the I/O nodes from the first selection of I/O nodes 120, or main unit 180 can be coupled to a dedicated test control node not shown, for switching the electronic circuit to a test mode upon receipt of a test mode select signal. As another option, the test control node not shown can be coupled directly to the first selection of I/O nodes 120 and the second selection of I/O nodes for connecting the I/O nodes to the test unit responsive to the test mode select signal.

Now, the following FIGS. are described in backreference to FIG. 1. Corresponding reference numerals have the same meaning unless explicitly stated otherwise. As stated before, it is advantageous to couple the respective inputs 121–124 to respective outputs 131–134 via an alternating pattern of buffers 141, 143 and inverters 142, 144. The main reason for using such an alternating scheme is that such an arrangement is capable of detecting the relative location of so-called wired AND shorts between a pair of interconnects of electronic circuit 100 with a further electronic circuit not shown that is testable through a pair of connections between the first selection of I/O nodes 120 and the second selection of I/O nodes 130 via a buffer and an inverter respectively. This can be particularly advantageous when multiple faults occur on the input interconnections of the circuit under test, because the combinatorial circuit 160 may then not be capable of locating all faults on the input side. In addition, if a limited set of test vectors has to be used because of test time issues, the test coverage provided by the combinatorial circuit 160 may be incomplete. Apart from the obvious test coverage advantages on the interconnects at the output side of electronic circuit 100, the measures of the present invention will also help to increase the test coverage on the input side of the electronic device 100 in the aforementioned cases. It is emphasized that these cases have been selected by way of non-limiting example only.

Figure 2A:
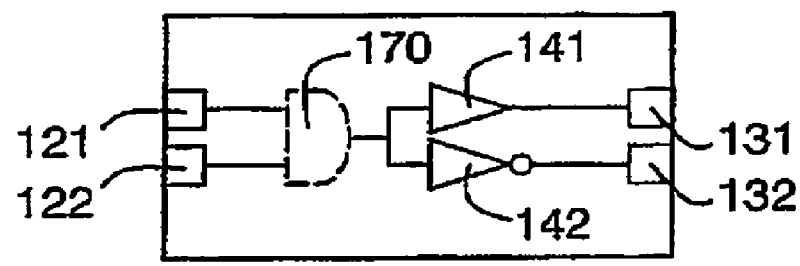
FIG. 2a depicts an interconnect fault that can be detected by the electronic circuit with a test unit according to the present invention.
Figure 2B:
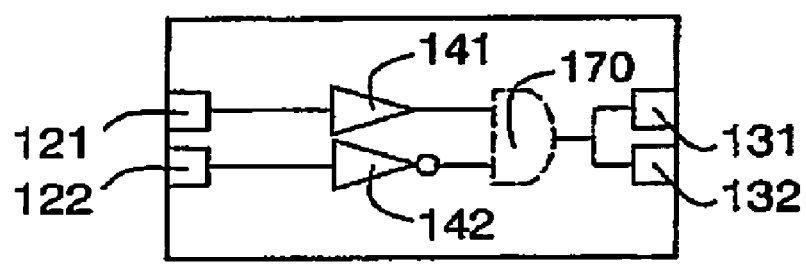
FIG. 2b depicts another interconnect fault that can be detected by the electronic circuit with a test unit according to the present invention.

In FIG. 2a, the presence of a wired AND short 170 between the interconnections associated with I/O node 121 and I/O node 122 is schematically depicted, while in FIG. 2b a wired AND short 170 between the interconnections associated with I/O node 131 and I/O node 132 is schematically depicted. In Table II, the impact of the wired AND short 170 on test stimuli provided to I/O nodes 121 and 122 is given for both locations of the wired AND short 170.

| test pattern provided to I/O nodes 121, 122 | Test result at I/O nodes 131, 132 for wired AND in location of FIG. 2a | Test result at I/O nodes 131, 132 for wired AND in location of FIG. 2b |
|---|---|---|
| 00 | 01 | 00 |
| 10 | 01 | 11 |
| 01 | 01 | 00 |
| 11 | 10 | 00 |

It will be clear that the two different locations of the wired AND short 170, e.g. in front or behind the buffer 141/inverter 142 pair, has a distinct influence on the test result patterns received through I/O nodes 131 and 132. It will be obvious to those skilled in the art that this level diagnosis is not available when the buffer 141/inverter 142 pair is replaced by a pair of inverters or a pair of buffers. Consequently, for those arrangements the localization of the wired AND short 170 is not feasible.

Figure 3:
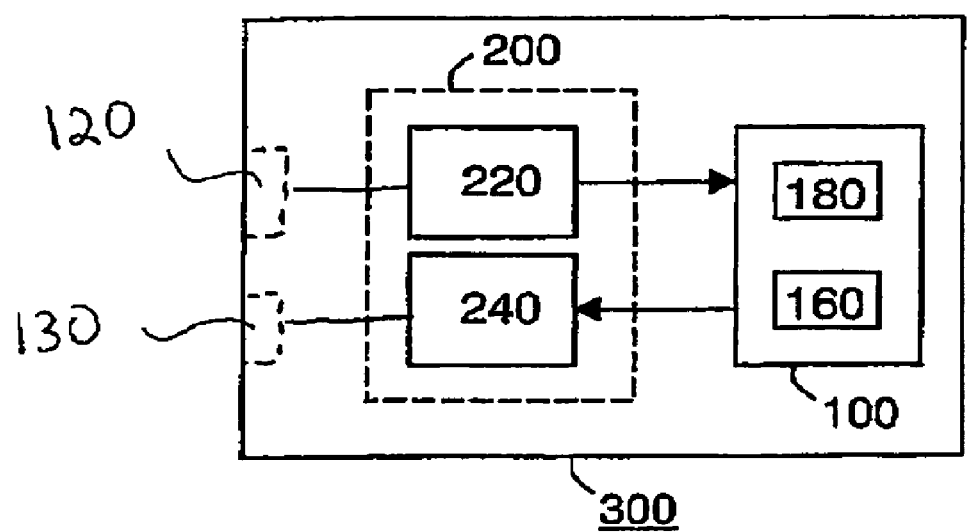
FIG. 3 depicts an electronic circuit arrangement according to the present invention.

In FIG. 3, the first selection of I/O nodes 120 of electronic circuit 100 is interconnected to a further electronic circuit 220 forming an electronic circuit arrangement 300. The second selection of I/O nodes 130 is at least partly interconnected to an additional electronic circuit 240. The further electronic circuit 220 and the additional electronic circuit 240 can be separate electronic circuits or can both be integral parts of an electronic circuit 200. Further electronic circuit 220 can operate as the test engine for the testing of the interconnects between electronic device 100 and further electronic device 220 in analogy with the test arrangements disclosed in European patent application EP 0979418-A1. In addition, the test arrangement of the present invention also allows for an interconnect test of the interconnects between the second selection of I/O nodes 130 of electronic circuit 100 and the additional electronic circuit 240. Consequently, the electronic circuit arrangement 300 effectively includes a built-in self-test arrangement for the interconnect test of electronic circuit 100.

For instance, further electronic circuit 220 can be equipped with a boundary scan chain not shown, which may be shared with additional electronic circuit 240. The boundary scan chain can be used to shift both the predefined bit patterns for selecting the test mode of the electronic circuit 100 as well as the test patterns for testing the interconnects of electronic circuit 100 into the electronic circuit 100 via the first selection of I/O nodes 120. Alternatively, the test mode selection of electronic device 100 can also be realized by a connection between control logic not shown in further electronic device 220 and a dedicated test control node not shown of electronic device 100. The test patterns may be stored in a dedicated data storage device not shown, which can be part of electronic circuit 220. The same boundary scan chain can also be arranged to receive the test result data via the second selection of I/O nodes 130, thus implying that the further electronic circuit 220 and additional electronic circuit 240 are an integral part of electronic circuit 200. Alternatively, electronic circuit 240 can be equipped with a separate boundary scan chain not shown. It will be obvious to those skilled in the art that the proposed boundary scan arrangements can also be replaced by data communication buses without departing from the scope of the invention.

The teachings of the present inventions provide the following test method for the electronic circuit 100 of FIG. 1. In a first step, the test unit is logically connected to the interconnects; this step embodies the selection of the test mode of the electronic circuit as previously described.

Subsequently, test data is put on the interconnects by the further electronic circuit and the test result data is received through the first I/O node, thus yielding the test result data obtained from the modification of the test data by combinatorial circuit 160.

In addition, further test result data is received through a second I/O nodes 131 from the second selection of I/O nodes 130, the second I/O node 131 being coupled to an I/O node 121 from the first selection of I/O nodes 120 in the test mode. This provides additional test coverage, because a test result concerning the interconnect between second I/O node 131 and the further electronic circuit not shown is provided this way.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An electronic circuit, comprising:
  a plurality of input/output (I/O) nodes for connecting the electronic circuit to at least a further electronic circuit;
  a test unit for testing the electronic circuit in a test mode of the electronic circuit, the test unit comprising a combinatorial circuit having a plurality of inputs and an output, the combinatorial circuit implementing an exclusive logic function;
  the I/O nodes being logically connected to the test unit in the test mode, wherein:
  a first selection of the I/O nodes is arranged to carry respective input signals and is connected to the plurality of inputs of the combinatorial circuit; and
  a second selection of the I/O nodes comprises a first I/O node and is arranged to carry respective output signals, the first I/O node being coupled to the output of the combinatorial circuit; and
  the second selection of I/O nodes further comprises a second I/O node that is coupled to an I/O node from the first selection of I/O nodes in the test mode via a connection that includes at least one of a buffer and an inverter, wherein the inverter facilitates a third I/O node from the second selection of I/O nodes being coupled to a further I/O node from the first selection of I/O nodes via a connection that bypasses the combinatorial circuit, and the buffer facilities at least the second I/O node being coupled to the I/O node from the first selection of I/O nodes.

2. An electronic circuit, comprising:
  a plurality of input/output (I/O) nodes for connecting the electronic circuit to at least a further electronic circuit;
  a test unit for testing the electronic circuit in a test mode of the electronic circuit, the test unit comprising a combinatorial circuit having a plurality of inputs and an output, the combinatorial circuit implementing an exclusive logic function;
  the I/O nodes being logically connected to the test unit in the test mode, wherein:
  a first selection of the I/O nodes is arranged to carry respective input signals and is connected to the plurality of inputs of the combinatorial circuit;
  a second selection of the I/O nodes comprises a first I/O node and is arranged to carry respective output signals, the first I/O node being coupled to the output of the combinatorial circuit;
  the second selection of I/O nodes further comprises a second I/O node that is coupled to an I/O node from the first selection of I/O nodes in the test mode via a connection that bypasses the combinatorial circuit; and
  at least one of the second I/O node is coupled to the I/O node from the first selection of I/O nodes via a buffer circuit and the third I/O node is coupled to the further I/O node from the first selection of I/O nodes via an inverter.

3. The electronic circuit as claimed in claim 1, further comprising a test control node, the electronic circuit being arranged to switch to the test mode responsive to the reception of a test control signal on the test control node.

4. The electronic circuit as claimed in claim 1, further comprising a main unit being logically connected to the I/O nodes in a functional mode of the electronic circuit, the main unit being arranged to bring the electronic circuit into the test mode upon receipt of a test control signal in a form of a predefined bit pattern through at least a subset of the first selection of I/O nodes.

5. An electronic circuit arrangement, comprising:
  an electronic circuit as claimed in claim 3 or 4; and
  a further electronic circuit,
  wherein the further electronic circuit is arranged to provide the electronic circuit with the test control signal and to provide the first selection of I/O nodes with test patterns for testing the electronic circuit.

6. The electronic circuit arrangement as claimed in claim 5, wherein the further electronic circuit is arranged to receive test result data from the second selection of I/O nodes.

7. A method for testing an electronic circuit, the electronic circuit comprising:
  a plurality of input/output (I/O) nodes for connecting the electronic circuit to a further electronic circuit;
  a test unit for testing the electronic circuit in a test mode of the electronic circuit, the test unit comprising a combinatorial circuit having a plurality of inputs and an output, the combinatorial circuit implementing an exclusive logic function;
  the I/O nodes being logically connected to the test unit in the test mode, wherein:
  a first selection of the I/O nodes is arranged to carry respective input signals and is connected to the plurality of inputs of the combinatorial circuit; and
  a second selection of the I/O nodes comprises a first I/O node and is arranged to carry respective output signals, the first I/O node being coupled to the output of the combinatorial circuit;

the method comprising the acts of:

logically connecting the test unit to the electronic circuit;

putting test data to the electronic circuit by the further electronic circuit; and receiving test result data through the first I/O node;

receiving further test result data through a second I/O node from the second selection of I/O nodes, the second I/O node being coupled to an I/O node from the first selection of I/O nodes in the test mode via a connection that includes at least one of a buffer and an inverter, wherein the inverter facilitates a third I/O node from the second selection of I/O nodes being coupled to a further I/O node from the first selection of I/O nodes via a connection that bypasses the combinatorial circuit, and the buffer enables at least the second I/O node being coupled to the I/O node from the first selection of I/O nodes.

* * * * *